United States Patent [19]

Leuschner et al.

[11] Patent Number: 5,556,812
[45] Date of Patent: Sep. 17, 1996

[54] CONNECTION AND BUILD-UP TECHNIQUE FOR MULTICHIP MODULES

[75] Inventors: Rainer Leuschner, Erlangen; Hellmut Ahne, Roettenbach; Siegfried Birkle, Hoechstadt; Albert Hammerschmidt, Erlangen; Recai Sezi, Roettenbach; Tobias Noll, Aachen, all of Germany; Ann Dumoulin, Zedelgem, Belgium

[73] Assignee: Siemens Aktiengesellschaft, Munich, Germany

[21] Appl. No.: 495,246

[22] Filed: Jun. 27, 1995

[30] Foreign Application Priority Data

Jun. 27, 1994 [DE] Germany ............... 44 22 345.5

[51] Int. Cl.$^6$ .................................. H01L 21/60
[52] U.S. Cl. ................. 437/209; 437/180; 437/183; 437/189; 437/203; 427/96
[58] Field of Search ............... 437/209, 180, 437/182, 183, 190, 192, 193, 203, 189; 427/96, 97, 98, 99

[56] References Cited

U.S. PATENT DOCUMENTS

| | | | |
|---|---|---|---|
| 4,956,313 | 9/1990 | Cote et al. | 437/203 |
| 5,108,785 | 4/1992 | Lincoln et al. | 427/96 |
| 5,151,300 | 9/1992 | Itsuji | 427/96 |
| 5,153,023 | 10/1992 | Orlowski et al. | 427/98 |
| 5,171,712 | 12/1992 | Wang et al. | 437/183 |
| 5,192,714 | 3/1993 | Suguro et al. | 437/192 |
| 5,270,253 | 12/1993 | Arai et al. | 437/190 |
| 5,286,713 | 2/1994 | Yokoyama et al. | 427/97 |
| 5,474,651 | 12/1995 | Huebner | 437/203 |
| 5,476,814 | 12/1995 | Ohshima et al. | 437/203 |

*Primary Examiner*—Kevin M. Picardat
*Attorney, Agent, or Firm*—Kenyon & Kenyon

[57] ABSTRACT

A method for manufacturing multichip modules having layer sequences made of dielectric material with conducting tracks embedded therein is characterized by the following features: (1) a temperature-resistant, base-resistant polymer having a dielectric constant $\leq 3$ is used as a dielectric material, which is applied to a non-conductive substrate and serves as an edge boundary for currentless, autocatalytic build-up of the conducting tracks; (2) the dielectric material is provided with a layer made of material which is soluble in organic solvents (lift-off layer); (3) the dielectric material and the lift-off layer are structured in a single lithographic step, either a direct or an indirect structuring taking place and grooves having an aspect ratio $\geq 1$ being formed in the dielectric material; (4) a metallic seed layer is applied to the dielectric material or rather to the lift-off layer through vapor deposition in a directed manner; (5) the lift-off layer is removed using an organic solvent; and (6) conducting tracks are created in the grooves through currentless metal deposition.

20 Claims, 1 Drawing Sheet

CONNECTION AND BUILD-UP TECHNIQUE FOR MULTICHIP MODULES

BACKGROUND OF THE INVENTION

The present invention relates generally to methods for manufacturing multichip modules, and more particularly to a method for generating a multichip module having sequential layers made of dielectric material with conducting tracks embedded therein.

Due to the progressive miniaturization of logic circuits in silicon chips, the limits of conventional printed circuit board technology have been reached for establishing the wiring between different chips. This can be attributed primarily to the fact that—due to Rent's rule—the number of connections per chip (bond pads) grows as the number of gates increases ("GEC Journal of Research", Vol. 7 (1989), No. 1, pp. 16–27). Accordingly, the conducting tracks on the printed circuit board must then become narrower since, otherwise, it is not possible to introduce a sufficient number of conducting tracks on the chip. As the number of conducting tracks increases, however, the number of conducting track levels also increases, which represents a difficult challenge for production technology. With the number of levels, namely, the topography as well as the deformation of the substrate increase, which degrades the lithographic image quality.

So-called multichip modules (MCMs) are regarded as a solution to this problem. These are components consisting respectively of multiple unhoused chips, which are arranged together—with a great wiring density—on a substrate. In multichip modules, a departure is made from conventional printed circuit board technology, and methods from silicon technology are used for connection and build-up. In this manner, it is possible to reduce the width of the conducting tracks from approximately 100 µm to a few ("Journal of the Electrochemical Society", Vol. 137 (1990), pp. 961–966).

In connection and build-up techniques for MCMs, a number of points must be considered, particularly with regard to the material properties and the structurability of the dielectrics used as well as the topography or rather the planarization. This also includes the aspect ratio of the conducting tracks, which indicates the ratio of height to width. In all MCM structures known until now, the aspect ratio is <1, i.e., the conducting tracks are arranged to lie flat.

To build up MCMs, it is already known to use a dielectric on the basis of benzocyclobutene (BCB) ("National Electronic Packaging and Production Conference", Boston, Jun. 11–14, 1990, conference report, pp. 667–672). The advantages of this material are related to the low dielectric constant (DK<3) and—in comparison to conventional polyimides—the very low shrinkage during drying ("curing"). The low dielectric constant enables thinner layers, a shorter conducting track separation and higher speeds of propagation, whereas good planarization properties result from the low shrinkage. However, structures having a relatively high aspect ratio cannot be fully planarized with BCB, such that for multiple layers the irregularities are intensified, which in turn can entail problems with the image definition when imaging very small conducting track structures. The known structures thus have also a low aspect ratio (conducting track width: 22 µm; conducting track height: 2 µm; BCB layer thickness: 5.5 µm). Since the BCB polymer contains silicon, the structuring is also relatively difficult. BCB can be etched, namely, only in an oxygen/fluorine plasma, for which reason no simple resist containing silicon can be used, but rather an auxiliary etching mask made of metal (copper) is required. This copper etching mask is, for its part, structured using a resist and through wet etching and, following the BCB etching, dissolved in nitric acid. The conducting tracks, which are made of aluminum, are also created using a resist and through wet etching, i.e., using a method which does not allow a high aspect ratio.

Also in another known method for building up MCMs, the conducting tracks, which are made of copper, are created using a resist and through wet etching ("SPE Conference on Photopolymer Principles—Processes and Materials", Ellenville, N.Y., Oct. 28–30, 1991, conference report, pp. 401–416). Despite the relatively low aspect ratio (conducting track width: 18 µm conducting track height: 5 µm), a special planarization technique is necessary here in which a photosensitive polyimide is applied over the created conducting tracks and—in an additional lithographic step—exposed in a manner such that it can be removed on the conducting tracks through development, whereas it remains between the conducting tracks, the irregularities being decreased in this process. Using a second layer of polyimide, the remaining topography is then leveled.

In a further known method, a good planarization is achievable likewise ("41th Electronic Components & Technology Conference", 1991, conference report, pp. 727–730). Here, the conducting track structures are produced using a photoresist and through wet etching of an underlying copper layer. A synthetic film made of polyimide is then laminated at increased temperature on these structures in a manner such that it envelops the copper tracks and is also compressed into the grooves between the conducting tracks. A good planarization is achieved; however, this method is usable only with conducting track geometries having a low aspect ratio which offer no large corroding surface for mechanical damages.

Moreover, a method is known in which a photoresist is structured photolithographically on a thin, chromium-copper layer sputtered on a substrate ("34th Electronic Components Conference", 1984, conference report, pp. 82–87) and which serves as a lateral boundary for the galvanic build-up of conducting tracks (semi-additive technique). Following the stripping of the resist, the thin chromium-copper layer is etched away such that conducting tracks which are electrically isolated from one another are obtained. A polyimide precursor is then applied over this as a dielectric, which—after the lithographic opening of the via holes—is converted through annealing into a polyimide. In this manner, it was possible—using a suitable photoresist—in principle to produce conducting tracks having a high aspect ratio, but the dielectric was able to level these conducting tracks only highly unsatisfactorily such that the problems with regard to the topography would intensify from level to level. The structures produced thus have an aspect ratio of only 0.5.

In another method based on the semi-additive technique, the conducting tracks which are created are covered with polyimide applied by spinning ("8th International Electronics Packaging Conference", November 1988, conference report, pp. 174–189). Still, to achieve good planarization, the resulting rippled layer must be smoothed out through mechanical polishing. However, this technique is very complicated since the layer thickness of the dielectric material over the conducting tracks is hard to control during surface grinding. If the polyimide is ground away excessively at spots, crosstalk can result at these spots between conducting tracks arranged on top of one another, i.e., the result is an impedance which can no longer be controlled or even a short-circuit.

Moreover, for producing MCMs, a method is known in which groove structures are created on a wafer using a photosensitive polyimide and then filled in a galvanic way with copper conducting tracks (EP-PS 0 190 490); planarization of up to about 90% can be achieved here. The disadvantage of this procedure lies in the electroplating of the copper, which requires, first, the photolithographic structuring of a thin metal layer; second, the precision alignment of the polyimide structures (relative to this metal layer); and third, the contacting of all conducting tracks with a 5 mm wide ring electrode situated on the edge of the wafer. The contacts must be removed at a later point in an additional work step (for example, using laser ablation). In comparison to other techniques, this method necessitates an additional photolithographic step for structuring the conducting tracks and is thus significantly more expensive.

There is also a known method in which a thermally curable, photosensitive polyimide precursor is used over which a metal layer, generally made of titanium, is applied, and thermally non-curable, photosensitive polyimide is applied over that (EP-OS 0 290 222). The photosensitive polyimide is exposed via a mask in a structuring manner and then developed, so that the metal layer is uncovered in places and then removed at these places with an etching solution. The lowest layer made of the polyimide precursor is then uncovered in turn, which is then dissolved out using a suitable solvent which does not attack the upper polyimide layer to the extent that the metal layer and the polyimide layer overhang somewhat. Through annealing treatment, e.g., at 320° C., the polyimide precursor is converted to insoluble polyimide; the upper polyimide layer remains soluble as before. During another treatment using an etching solution, the overhanging part of the metal layer is etched away such that the lower polyimide layer is now overhung only by the upper polyimide layer. Then, a thin chromium layer and, afterwards, a copper layer is sputtered on this structure and the upper, soluble polyimide layer (together with the metal layers situated thereupon) is removed using a lift-off process. The remaining, relatively thin metal layers (made of chromium or rather copper), which cover only the bottom and the side walls of the grooves, serve as a seed layer for subsequent currentless deposition of copper through which the grooves are completely filled. In this manner, conducting tracks are created which terminate with the upper edge with the dielectric, i.e., a flat plane is formed. A further layer of a thermally curable, photosensitive polyimide precursor is applied thereupon, which is exposed in a structuring manner and then developed to uncover via holes. Afterwards, the process begins anew in order to build up the next level. This method, which can be used to achieve good planarization of the build-up from level to level, is suitable in cases where relatively wide conducting tracks are required; however, it is not suited to producing conducting tracks having a high aspect ratio.

In another method, a photosensitive polyimide precursor is applied to a roughened substrate pretreated with a catalyst for currentless metal deposition (WO 88/05252). The polyimide precursor is exposed via a mask in a structuring manner and subsequently developed. The catalyst layer is uncovered in spots in this process; then, a currentless, autocatalytic metal deposition (of copper, nickel or gold) takes place at these spots. With this method as well, good planarization of the build-up can be achieved from level to level if relatively wide conducting tracks are created. However, it is also not suited to producing conducting tracks having a high aspect ratio.

If conducting tracks having an aspect ratio $\geq 1$ (e.g., 1.5) can be built up, wherein they are arranged to stand on edge, they can be—with the same cross-section, i.e., the same frequency-dependent impedance—more tightly packed, which would allow a tighter packing of the pads on the chip side and reduce the number of conducting track levels. This would also make it possible to shorten the conducting tracks—and thus the propagation times of the pulses. This is important because, as the reduction in the dimensions of the chips proceeds, the pulse propagation delay times are also reduced and thus enter into the order of magnitude of the propagation times, which can lead to disruptions of the electrical signals.

Furthermore, conducting track levels must also possess defined characteristic impedances, which result from the output impedances of the drivers (chip output) or rather from the geometry of the multilayer system of the connection technique. A connection and build-up technique which makes it possible to create conducting tracks having an aspect ratio >1 and having a width down to approx. 5 to 10 μm would possess decisive advantages over the previously known techniques. However, a higher aspect ratio of the conducting tracks poses a greater challenge to the planarization technique since—for a multiplicity of levels—the topography would soon be higher than the clearance with regard to the focus. A connection and build-up technique of the named type must therefore also make it possible to properly planarize conducting tracks standing on edge. Moreover, the dielectric situated between the conducting tracks must possess a low dielectric constant since a high aspect ratio is advantageous only if the conducting tracks can be tightly packed without crosstalk occurring.

The present invention is directed to the problem of developing a connection and build-up technique for multi-chip modules—having sequential layers made of dielectric material with conducting tracks embedded therein which also allows production of conducting tracks having an aspect ratio $\geq 1$.

SUMMARY OF THE INVENTION

The present invention solves this problem by: (1) using a temperature-resistant, base-resistant polymer having a dielectric constant $\leq 3$ as the dielectric material, which is applied to a non-conductive substrate and serves as an edge boundary for currentless, autocatalytic build-up of the conducting tracks; (2) providing the dielectric material with a layer made of material which is soluble in organic solvents (lift-off layer); (3) structuring the dielectric material and the lift-off layer in a single lithographic step, either a direct or an indirect structuring taking place and grooves having an aspect ratio $\geq 1$ being formed in the dielectric material; (4) applying a metallic seed layer to the dielectric material or rather to the lift-off layer through vapor deposition in a directed manner; (5) removing the lift-off layer using an organic solvent; and (6) creating conducting tracks in the grooves through currentless metal deposition.

In the method according to the present invention, conducting tracks standing on edge or such having an approximately quadratic cross-section are built up on a suitable substrate, such as a silicon wafer or a ceramic substrate having a metal coating and a dielectric situated thereover, using an additive technique. The conducting tracks are produced through currentless metal deposition, with autocatalytic baths known per se serving this purpose, which provide—with acceptable deposition rates—conducting tracks with good ductility of the metal, e.g., copper. Multiple MCM substrates can be dipped into the deposition bath simultaneously, which is recirculated and automatically made up.

In order to limit the currentless growth of the conducting tracks—and also the via holes—in width, a photostructured dielectric serves as a lateral boundary. The following measures are undertaken for this purpose:

1. The dielectric is structured directly or indirectly, the grooves in the dielectric determining the conducting track width.
2. A soluble, i.e., lift-off-enabled, layer is situated over the dielectric, which layer has the same structures as the dielectric layer. These two stacked layers are, namely, simultaneously structured photolithographically—in a single step—which is highly advantageous from the viewpoint of process technology.
3. Following the structuring of the lift-off layer and the dielectric, the substrate (with the layers situated thereupon) is provided anisotropically, i.e., in a directed manner, namely, perpendicularly from the top, with a thin seed layer, such as a palladium layer produced through vaporization.
4. Through a lift-off process, the layer situated on the dielectric—together with the seed layer situated thereupon—is removed.

For the lift-off process, a slight overhang of the side walls of the structures is advantageous since in this manner a coating of the side walls with the seed layer can be avoided. It is thus also guaranteed that the seed layer for the currentless metal deposition is situated only in the bottom of the grooves uncovered in the dielectric. On the other hand, it is ensured that a build-up of the conducting tracks from the bottom up is possible without the risk of the conducting tracks—in the upper part—building up from the side, in which case cavities would arise therein. Since the aspect ratio of the conducting tracks is to be $\geq 1$, the requirement for an exclusive seeding on the bottom of the grooves is particularly important. If, namely, the currentless build-up of conducting tracks is interrupted when the upper edge of the dielectric is reached, good planarization of the conducting track levels can be obtained in a simple manner.

For dielectric isolation of a level with respect to the next one, a further layer of the dielectric is applied to the structure produced in the manner previously described; via holes are then created in a corresponding manner. To produce the via holes, however, no lift-off-enabled layer is required since a seed layer is not necessary because the via holes end at the copper situated thereunder. Through the upper layer of the dielectric, remaining small irregularities of the conducting track level are compensated such that, upon termination of a complete MCM level, one can start out from a smooth surface without topography.

In order to facilitate currentless metal deposition, particularly of copper, the dielectric must be resistant to the highly alkaline baths (deposition conditions, depending on the layer thickness: up to several hours at 70° C. and pH 12). The leaching out of constituents of the dielectric could influence the stability of the bath and the layer properties. Moreover, the dielectric must also exhibit a good bond with the lower level so that, as could occur in case of poor adhesion, ions cannot penetrate into the gap between the individual layers and lead to corrosion in the component at later point in time. The thermal expansion coefficient of the dielectric should be matched insofar as possible to the substrate in order to avoid stresses which could lead to tears. On the other hand, the extensibility of the dielectric should be as great as possible such that unavoidable stresses in a multilayer build-up do not lead to cracks.

The substrate is generally a silicon wafer coated with metal and with a dielectric; instead of the silicon wafer, a flat sheet of ceramic material, composite material or glass can also be used. Moreover, a flat sheet of metal provided with a dielectric can also serve as a substrate. In particular, polybenzoxazole and polyimide serve as the dielectric material which is a temperature-resistant, base-resistant polymer having a dielectric constant $\leq 3$. However, polyphenyl quinoxaline, polyether and polybenzocyclobutene as well as other polymer materials having suitable properties can also be used.

In the method according to the present invention, the metal for the conducting tracks is advantageously deposited from an aqueous metal salt solution, preferably from a copper salt solution; nickel and gold are other possible metals. The metallic seed layer consists advantageously of palladium, which can be applied advantageously through vaporization; the seed layer can also be made of silver, for example. Before the seed layer, a thin bond layer can also be applied advantageously, preferably made of chromium; however, the bond layer can also consist of niobium, for example. The adhesion of the seed layer—and also the adhesion of the conducting tracks—can also be improved by vapor depositing the metal of the seed layer in a cluster system.

The simultaneous structuring of the dielectric and the lift-off layer takes place in a direct or indirect way. In direct structuring, it is necessary for the dielectric material and the material of the lift-off layer to be photosensitive. In indirect structuring, a photoresist which contains silicon or which can be silylated is used as the material for the lift-off layer, and an etching process takes place in an oxygen plasma. In this case, the resist also serves as an etching stop layer for the next level to be structured.

In the method according to the present invention, the structuring takes place preferably according to the following techniques which offer the best resolution with good process tolerances:

(1) Indirect Structuring Using a Positive Resist Process

Here, a three-layer system, consisting of a photoresist which contains silicon or which can be silylated, a lift-off-enabled intermediate layer and a silicon-free organic dielectric, is exposed via a mask; then, the resist is developed and possibly—from the gas phase or from a solution—silylated and the resist structure transferred to the intermediate layer and to the dielectric through reactive ion etching using oxygen ($O_2$/RIE). Afterwards, a seed layer is applied and the photoresist as well as the intermediate layer removed using a solvent which does not attack the dielectric.

(2) Indirect Structuring Using a Negative Resist Process

Here, a two-layer system, consisting of a silylatable TSI resist (TSI=Top Surface Imaging) and a silicon-free organic dielectric, is exposed via a mask; then, the resist is possibly—from the gas phase or from a solution—silylated and the resist structure transferred to the dielectric through dry development of the two layers using $O_2$/RIE. Afterwards, a seed layer is applied and the TSI resist removed using a solvent which does not attack the dielectric.

(3) Direct Structuring

Here, a two-layer system, consisting of a photoresist which bleaches when exposed (such as a standard positive resist) and a dielectric which can be directly structured (such as a polybenzoxazole precursor having diazo naphthoquinone as a photoactive component) is exposed via a mask, and then the two layers are developed, e.g., using an alkaline developer. Afterwards, a seed layer is applied and the photoresist removed using a solvent which does not attack the dielectric. Finally, the dielectric is annealed.

However, the structuring can also take place in a manner such that a three-layer system, consisting of a photoresist, a vapor-deposited or sputter-deposited metal layer (e.g., of aluminum) and a silicon-free organic dielectric, is exposed via a mask; then, the resist is developed and the metal is etched using a wet chemical treatment or in halogen plasma. Subsequently, the structure in the metal is transferred to the dielectric through $O_2$/RIE, the photoresist being fully ashed. Afterwards, the seed layer is applied and the metal is removed using a suitable acid or base. Another means of structuring involves exposing a two-layer system, consisting of a photoresist and an organic dielectric, with an excimer laser via a mask such that the exposed locations of both layers are ablated. Afterwards, the seed layer is applied and the photoresist removed using a solvent.

Using the named structuring techniques, it is also possible to construct via holes with no problem from the top-most to the bottom-most level in a layer-by-layer manner since each new layer is applied to a well planarized base and reflections at the lower via holes play no role. This is not always the case with other techniques. Instead, via holes are often arranged there over multiple levels like stair-steps (known as "stair-stepped vias") in order to decrease the topography and avoid reflections. However, this procedure necessitates more space for the via holes.

BRIEF DESCRIPTION OF THE DRAWING

The sole FIGURE depicts the succession of the individual process steps schematically for the structuring technique (2).

DETAILED DESCRIPTION

Figure 1A:
Figure 1B:
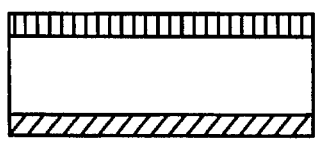
Figure 1C:
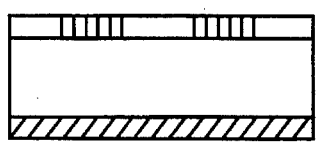
Figure 1D:
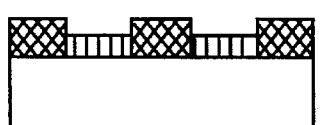
Figure 1E:
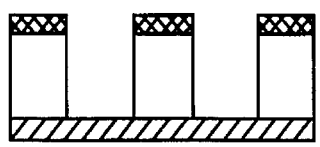
Figure 1F:
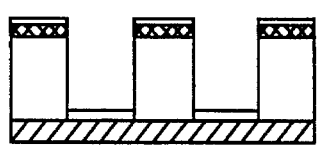
Figure 1G:
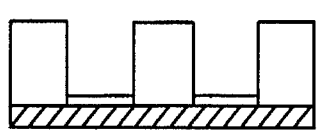
Figure 1H:
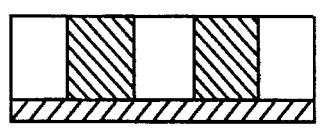
Figure 1I:
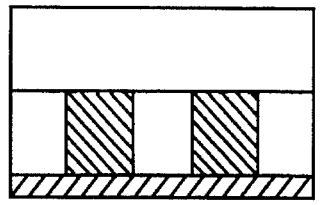
Figure 1J:
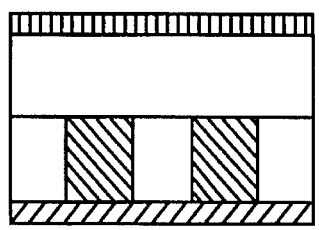
Figure 1K:
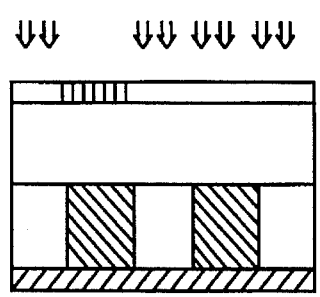
Figure 1L:
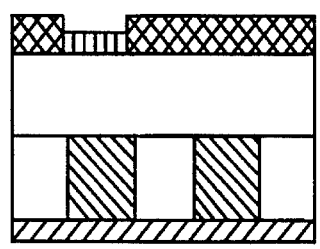
Figure 1M:
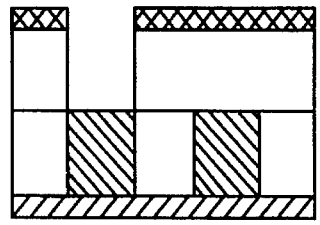
Figure 1N:
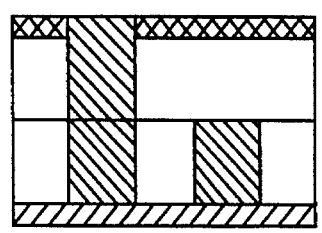

In the method depicted in the sole FIG, the following steps are carried out:

a) a dielectric is applied by spinning on a non-conductive substrate, dried and annealed;

b) a silylatable TSI resist is applied to the dielectric and dried;

c) the resist is—in order to build up conducting tracks—exposed via a mask;

d) the resist is silylated and dried;

e) the resist structure is transferred to the dielectric (dry development using $O_2$/RIE);

f) a seed layer is applied to the structured surface;

g) the resist is removed (lift-off process);

h) conducting tracks are created through currentless metal deposition;

i) a dielectric is applied to the flat surface and annealed;

j) a silylatable TSI resist is applied to the dielectric and dried;

k) the resist is—in order to construct plated-through holes—exposed via a mask;

l) the resist is silylated and dried;

m) the resist structure is transferred to the dielectric (dry development using $O_2$/RIE) and annealed;

n) plated-through holes are created through currentless metal deposition.

Based on examples in which in each case the build-up of a two-layer MCM demonstrator having an aspect ratio of the conducting tracks of 1.5 is described, the present invention will be explained in greater detail.

EXAMPLE 1

A polyimide precursor (as a dielectric) is applied by spinning on a 4" silicon wafer provided over its entire surface with a 5 μm thick copper layer, dried at 100° C. and annealed under nitrogen at 350° C. (layer thickness: 9 μm). Then, a 0.2 μm thick silicon dioxide layer is applied by sputtering as an etching stop layer. The silicon wafer prepared in this manner serves as a substrate. Instead of the silicon wafer, a ceramic or glass base can also be used as the substrate, but the wafer has the advantage of possessing better flatness and being suitable for support and transport with customary process equipment in silicon technology.

A polybenzoxazole precursor is applied by spinning to the substrate (see EP-OS 0 291 778 and 0 291 779 in this connection), dried at 100° C. and annealed under nitrogen at 350° C. The annealing causes the precursor to be converted to base-resistant polybenzoxazole (PBO) which serves as a dielectric; this material has a dielectric constant of 2.8, and the layer thickness is 9 μm. A layer of an industry-standard resist based on polyglutarimide is applied by spinning to the dielectric in a manner such that—after drying at 180° C.—a layer having a thickness of 0.5 μm is obtained which represents a lift-off-enabled layer. A 0.8 μm thick layer of a silylatable resist based on an anhydride-group-containing polymer is applied by spinning to this layer (see in this connection: "SPIE Proceedings", Vol. 1262 (1990), pp. 528–537); this is then dried at 100° C., exposed via a mask having 6 μm wide conducting track structures (the structures are transparent on the mask) with 80 mJ/cm$^2$ (measured at 350 nm on the MA 56 Mask Aligner from the company S üss KG) and developed in an aqueous-alkaline developer (NMD-W 2.38% from the company Tokyo Ohka) for 2 min at room temperature. The resist structures created in this manner are silylated at room temperature for 3 min in an aqueous-alcoholic solution of an oligomeric diaminosiloxane (see in this connection: "SPIE Proceedings", Vol. 1262 (1990), pp. 528–537) such that the layer build-up amounts to 0.9 μm and then, using a plasma etching system (MIE 720, MRC company) transferred in 15 min through the lift-off layer into the PBO layer ($O_2$ flow: 20 sccm; power: 0.8 kW; pressure: 1.5 mTorr); an undercutting of approx. 300 nm results in this process. Subsequently, the substrate having the structured PBO layer is vapor-deposited in a vaporization system (UHV MU 500, Balzer company) with a very thin bond layer of chromium (approx. 3 nm) and a 20 nm thick palladium layer; then, the resist and the lift-off layer are removed in an ultrasonic bath. In a currentless copper bath (Cu-EDTA complex (EDTA=ethylenediaminetetraacetic acid), formaldehyde and NaOH; pH 12), Cu conducting tracks are created in the PBO grooves at 70° C. within 4 h, which conducting tracks terminate at the upper edge of the PBO layer with an accuracy of 0.5 μm.

A second layer of the polybenzoxazole precursor is applied by spinning to the structured Cu/PBO layer and dried and annealed in the described manner. A 0.8 μm thick layer of the silylatable resist is applied and dried—in this described manner—to the second PBO layer (layer thickness: 9 μm) obtained in this process and also exposed via a mask having via hole structures and then developed. The hole structures obtained in this process are silylated in the described manner (layer build-up: 0.9 μm) and then transferred to the PBO layer, the etching process terminating at the copper layer situated thereunder. By annealing the resist layer remaining after the etching at 350° C., this layer becomes fully insoluble and is thus subject to no corrosion in an acidic etching solution with which the superficial copper oxide film on the uncovered via holes is removed and in the bath with which the via holes are filled with copper in a currentless manner.

After the via holes are filled up with copper, the production of the first level is complete and the process is repeated with the application and structuring of a PBO layer for the next level. While etching this layer in the oxygen plasma, the annealed resist layer lying thereunder acts as an etching stop layer. At the places where via holes go from the second level to the first level, the resist layer containing silicon is opened during the preceding structuring so that a metallic connection is guaranteed between the two levels.

EXAMPLE 2

On a substrate corresponding to example 1, a PBO layer having a thickness of 9 µm and acting as a dielectric is created in the manner described there. A 0.9 µm thick layer of a silylatable top resist based on an anhydride-group-containing polymer is applied to the dielectric (see in this connection: "Microelectronic Engineering", Vol. 20 (1993), pp. 305–319); then, it is—in an appropriate manner—dried and exposed via a mask having conducting track structures (the structures are dark on the mask) with 200 mJ/cm$^2$. Afterwards, silylation is carried out in the described manner for 2 min at room temperature (layer build-up: 0.9 µm); then, the conducting track structures obtained in this process are transferred through plasma etching ($O_2$ flow: 60 sccm; power 0.9 kW; pressure: 3 mTorr) in 10 min through the resist layer into the PBO layer; an undercutting of approx. 300 nm takes place in this process. Subsequently—in the described manner—the substrate having the structured PBO layer is vapor-deposited with a bond layer of chromium and a palladium layer and the resist removed, and then, Cu conducting tracks are created in the PBO grooves through currentless deposition of copper.

On the structured Cu/PBO layer, as described in example 1, a second PBO layer is created (layer thickness: 9 µm). A 1.2 µm layer of the silylatable top resist is applied to this PBO layer and—in the above described manner—dried, exposed via a mask having via hole structures and silylated (layer build-up: 0.9 µm). The hole structures obtained in this process are—in the above described manner—transferred to the PBO layer, the etching process terminating at the copper layer situated thereunder. By annealing the layer of the silylated top resist remaining after the etching, this layer becomes fully insoluble. After the via holes are filled with copper, the procedure can be continued corresponding to example 1.

EXAMPLE 3

On a substrate corresponding to example 1, a resist solution—in the form of a solution of a polybenzoxazole precursor (see in this connection EP-OS 0 291 778 and 0 291 779) and a diester made of bisphenol-A and diazonaphthoquinone-5-sulphonic acid (as a photoactive component) in N-methylpyrrolidone—is applied by spinning and dried at 110° C. A solution of a further resist acting as an auxiliary resist—in the form of a solution of an industry-standard cresol novolak and a diester made of bisphenol-A and diazonaphthoquinone-5-sulphonic acid (as a photoactive component) in a mixture of benzyl alcohol and ethyl lactate—is applied to this resist, which serves as a precursor for the dielectric, and dried at 100° C. The two stacked resists are, as described in example 1, exposed via a mask having 8 µm wide conducting track structures (the structures are transparent on the mask) with 350 mJ/cm$^2$ and developed for 3 min at room temperature (developer NMD-W 2.14%, diluted in a 1:1 ratio with water). The bottom-most resist, which has somewhat better base-solubility, is more strongly developed such that an undercutting of approx. 500 nm arises. Afterwards, the substrate having the structured resist layers is—in the manner described in example 1—vapor-deposited with a bond layer made of chromium and a palladium layer and the upper resist removed with isopropanol. The lower resist, which represents a PBO precursor, is then annealed at 350° C. under nitrogen, the precursor being converted into base-resistant polybenzoxazole in this process (layer thickness: 9 µm; dielectric constant: 2.9). Following treatment of the substrate—for a duration of 20 s—in oxygen plasma, as described in example 1, the superficially oxidized palladium is treated with an aqueous reduction solution; then, Cu conducting tracks are created—in a manner corresponding to example 1—in the PBO grooves, which conducting tracks terminate at the upper edge of the PBO layer with an accuracy of 0.5 µm.

A second layer of the described resist (made of the PBO precursor and the photoactive component) is applied by spinning to the structured Cu/PBO layer and dried at 110° C. This is then exposed via a mask having via hole structures—in the above described manner—with 300 mJ/cm$^2$ and developed for 2 min at room temperature. The development process comes to a standstill at the copper layer situated thereunder. Afterwards, the resist is annealed under nitrogen at 350° C., polybenzoxazole being formed (layer thickness: 9 µm). The superficial copper oxide film on the uncovered via holes is then removed using an acidic etching solution; the via holes are then filled—in the above described manner—with copper through currentless metal deposition.

After the via holes are filled with copper, the production of the first level is complete and the process is repeated with the application and structuring of resist layers for the next level. While developing these layers, the annealed, alkali-insoluble PBO layer lying thereunder acts as stop layer. At the places where via holes go from the second level to the first level, the lower copper layer is uncovered after development so that a metallic connection is guaranteed between the two levels.

What is claimed is:

1. A method for manufacturing multichip modules having sequential layers made of a dielectric material with a plurality of conducting tracks embedded therein, comprising the steps of:

a) using a temperature-resistant, base-resistant polymer having a dielectric constant ≦3 as the dielectric material;

b) applying the dielectric material to a non-conductive substrate, which dielectric material serves as an edge boundary for currentless, autocatalytic build-up of the plurality of conducting tracks;

c) providing the dielectric material with a lift-off layer, which is a layer made of a material that is soluble in organic solvents;

d) structuring the dielectric material and the lift-off layer in a single lithographic step, either through direct or an indirect structuring;

e) forming a plurality of grooves having an aspect ratio ≧1 in the dielectric material;

f) applying a metallic seed layer to the dielectric material or to the lift-off layer through vapor deposition in a directed manner;

g) removing the lift-off layer using an organic solvent; and h) creating the plurality of conducting tracks in the grooves through currentless metal deposition.

2. The method according to claim 1, wherein the dielectric material and the material of the lift-off layer are photosensitive and a direct structuring takes place.

3. The method according to claim 1, wherein a photoresist which contains silicon or which can be silylated comprises the material for the lift-off layer and an indirect structuring takes place through etching in oxygen plasma.

4. The method according to claim 1, wherein the dielectric material is polybenzoxazole or polyimide.

5. The method according to claim 2, wherein the dielectric material is polybenzoxazole or polyimide.

6. The method according to claim 3, wherein the dielectric material is polybenzoxazole or polyimide.

7. The method according to claim 1, wherein the seed layer consists of palladium.

8. The method according to claim 2, wherein the seed layer consists of palladium.

9. The method according to claim 3, wherein the seed layer consists of palladium.

10. The method according to claim 1, further comprising the step of applying a thin bond layer before the seed layer.

11. The method according to claim 1, further comprising the step of applying a thin bond layer made of chromium, before the seed layer.

12. The method according to claim 2, further comprising the step of applying a thin bond layer made of chromium, before the seed layer.

13. The method according to claim 3, further comprising the step of applying a thin bond layer made of chromium, before the seed layer.

14. The method according to claim 1, further comprising the step of depositing the metal in the grooves from an aqueous metal salt solution.

15. The method according to claim 2, further comprising the step of depositing the metal in the grooves from an aqueous metal salt solution.

16. The method according to claim 14, wherein the aqueous metal salt solution comprises a copper salt solution.

17. The method according to claim 1, further comprising the steps of using a silicon wafer as the substrate and providing the silicon wafer with a thin metal layer and with a thin layer of a dielectric material.

18. The method according to claim 2, further comprising the steps of using a silicon wafer as the substrate and providing the silicon wafer with a thin metal layer and with a thin layer of a dielectric material.

19. The method according to claim 1, further comprising the step of creating a plurality of plated-through holes in a corresponding manner.

20. The method according to claim 2, further comprising the step of creating a plurality of plated-through holes in a corresponding manner.

* * * * *